United States Patent
Iwata et al.

(10) Patent No.: US 6,362,079 B1
(45) Date of Patent: Mar. 26, 2002

(54) SEMICONDUCTOR DEVICE AND METHOD OF ANODIZATION FOR THE SEMICONDUCTOR DEVICE

(75) Inventors: Hitoshi Iwata; Makoto Murate, both of Aichi-ken (JP)

(73) Assignee: Kabushiki Kaisha Tokai Rika Denki Seisakusho, Aichi-Ken (JP)

( * ) Notice: Subject to any disclaimer, the term of this patent is extended or adjusted under 35 U.S.C. 154(b) by 0 days.

(21) Appl. No.: 09/341,323

(22) PCT Filed: Jun. 5, 1998

(86) PCT No.: PCT/JP98/02507

§ 371 Date: Jul. 9, 1999

§ 102(e) Date: Jul. 9, 1999

(87) PCT Pub. No.: WO98/56036

PCT Pub. Date: Dec. 10, 1998

(30) Foreign Application Priority Data

Jun. 6, 1997 (JP) .............................................. 9-149511

(51) Int. Cl.$^7$ ...................... H01L 21/326; H01L 21/479
(52) U.S. Cl. ...................... 438/468; 438/960; 438/962; 438/762
(58) Field of Search ............................ 438/468, 53, 762, 438/761, 960, 962, 455, 458, 763, 52, 50, 238; 205/157, 257

(56) References Cited

U.S. PATENT DOCUMENTS 5,868,947 A * 2/1999 Sakaguchi et al. .............. 216/2
6,107,213 A * 8/2000 Tayanaka .................... 438/762

FOREIGN PATENT DOCUMENTS

| DE | 43 31 798 A 1 | 3/1995 |
| DE | 195 37 314 A 1 | 4/1996 |
| EP | 0 747 686 A 1 | 12/1996 |
| JP | 55-74181 | * 6/1980 |
| JP | 2-159770 | 6/1990 |
| JP | 08111533 | 4/1996 |
| JP | 52-46340 | 3/1997 |

OTHER PUBLICATIONS

Abstract for J08228016, Iwata Hitoshi, Surface Type Acceleration Sensor and Manufacture Thereof, Mar. 9, 1996.
Abstract for J08236784, Ishida T; Wantanabe A, Accelerate Sense Antilock Brake System Airbag System Suspension Control System Motor Vehicle Part Connect Open Back Side Silicon Substrate Width Larger Connect Open, Sep. 13, 1996.

* cited by examiner

*Primary Examiner*—Wael Tabury
*Assistant Examiner*—Fernando Toledo
(74) *Attorney, Agent, or Firm*—Vidas,Arrett & Steinkraus PA

(57) ABSTRACT

A first p-type silicon layer (3) is formed as a buried layer in a p-type single crystal silicon substrate (2), and an n-type silicon layer (4) is formed on the upper side of the silicon substrate (2). A second p-type silicon layer (5) for forming an opening is defined in the n-type silicon layer (4), and a metal protecting film (14) is formed on the upper side of the n-type silicon layer (4). An electrode layer (18) is formed on the rear side of the silicon substrate (2) via an oxide film (17). The electrode layer (18) and the silicon substrate (2) are electrically connected to each other via a connecting opening (17a) at portions aligned with the first p-type silicon layer (3). After a positive terminal and a negative terminal of a DC power source (V) are connected to the electrode layer (18) and to a counter electrode (11) respectively, a voltage is applied between the electrode layer (18) and the counter electrode (11) to carry out anodization.

6 Claims, 6 Drawing Sheets

SEMICONDUCTOR DEVICE AND METHOD OF ANODIZATION FOR THE SEMICONDUCTOR DEVICE

BACKGROUND OF THE INVENTION

The present invention relates generally to a semiconductor device and an anodization process for the same, and more particularly to an anodization process for imparting porosity to semiconductor devices at desired sites.

Anodization of silicon substrates has conventionally been practiced in micro-machining of silicon. An example of the conventional anodization process will now be described.

FIG. 5 shows a silicon substrate to be employed in a semiconductor device or acceleration sensor. In this drawing, a p-type silicon layer 3 is formed on the front side of a plane-oriented (110) p-type single crystal silicon substrate (hereinafter referred simply to as silicon substrate) 2 over a predetermined area. The p-type silicon layer 3 has a higher silicon concentration than the silicon substrate 2, and an epitaxial growth layer 4 of n-type single crystal silicon is formed over the upper surface of the silicon substrate 2. The p-type silicon layer 3 is buried under the epitaxial growth layer 4. A p-type silicon layer 5 for forming an opening 15 is defined in the epitaxial growth layer 4, and the layer 5 extends from the surface of the epitaxial growth layer 4 to the p-type silicon layer 3. On the epitaxial growth layer 4 excluding the area where the p-type silicon layer 5 is formed, an oxide ($SiO_2$) film 6 as a layer insulating film, a wiring pattern 7 such as of aluminum, a SiN or $Si_3N_4$ passivation film 8 for insulating the surface layer, and a resin protecting film 9 such as of photoresist having HF resistance are formed.

As shown in FIG. 6, the silicon substrate 2 is immersed together with the layers 3 to 9 in an aqueous HF solution (aqueous hydrofluoric solution) 10, and a counter electrode 11 which is a noble metal plate such as of Pt is disposed opposing the silicon substrate 2. An anode of a DC power source V is connected to the silicon substrate 2, and its cathode is connected to the counter substrate 11. Anodization is carried out by application of an electric field between the substrate 2 and the counter electrode 11. The p-type silicon layers 3 and 5 are converted to porous silicon layers, and the porous portions thus formed are removed by alkali etching in a later step to form a cavity. The epitaxial growth layer (n-type single crystal silicon) 4 present above the cavity constitutes a hollow beam and also assumes the structure of an acceleration sensor.

However, there are problems in that currents from the DC power source V in the anodization treatment diffuse to areas which need not be anodized, as indicated by the arrows in FIG. 5. This diffusion of electric currents (reactive currents) causes a voltage drop, which lowers the anodization rate in the areas to be anodized and the ranges to be subjected to porosity imparting treatment spread to the silicon substrate 2 side beyond the desired areas (i.e., p-type silicon layers 3 and 5). Accordingly, a cavity is formed beyond the desired area by the alkali etching in the later step.

It is an objective of the present invention to provide a process for anodizing a silicon substrate which can efficiently impart porosity selectively to the silicon substrate.

SUMMARY OF THE INVENTION

In order to attain the above objective, in the anodization process according to the present invention, the semiconductor device has a p-type single crystal silicon substrate. A first p-type silicon layer is formed on a first side of the p-type single crystal silicon substrate over a predetermined area. An n-type silicon layer is formed on the first side of the p-type single crystal silicon substrate. The first p-type silicon layer is a buried layer located under the n-type silicon layer. A second p-type silicon layer is defined in the n-type silicon layer so as to form an opening. A protecting film is formed on the n-type silicon layer with the surface of the second p-type silicon layer being exposed. An insulating film is formed on a second side, other side (the side opposite to the first side) of the p-type single crystal silicon substrate. An electrode layer which is formed under the insulating film has a connecting section at a portion aligned with the first p-type silicon layer and is connected electrically via the connecting section to the p-type single crystal silicon substrate. The anodization process includes the step of connecting a positive terminal of a DC power source to the electrode layer and also connecting its negative terminal to a counter electrode disposed to oppose the p-type single crystal silicon substrate and the step of applying a voltage between the electrode layer and the counter electrode so as to impart porosity to the first and second p-type silicon layers.

In the present invention, since the electrode layer is brought into contact with the p-type single crystal silicon substrate via the connecting section at least at the portion aligned with the buried p-type silicon layer, electric currents concentrate, when anodization is carried out, in the p-type silicon layer zone. Meanwhile, reactive currents diffusing to portions which are not to be anodized are inhibited. Thus, porosity is imparted selectively to the desired portions (selective porosity imparting treatment).

DETAILED DESCRIPTION OF THE PREFERRED EMBODIMENT

First Embodiment

Figure 1:
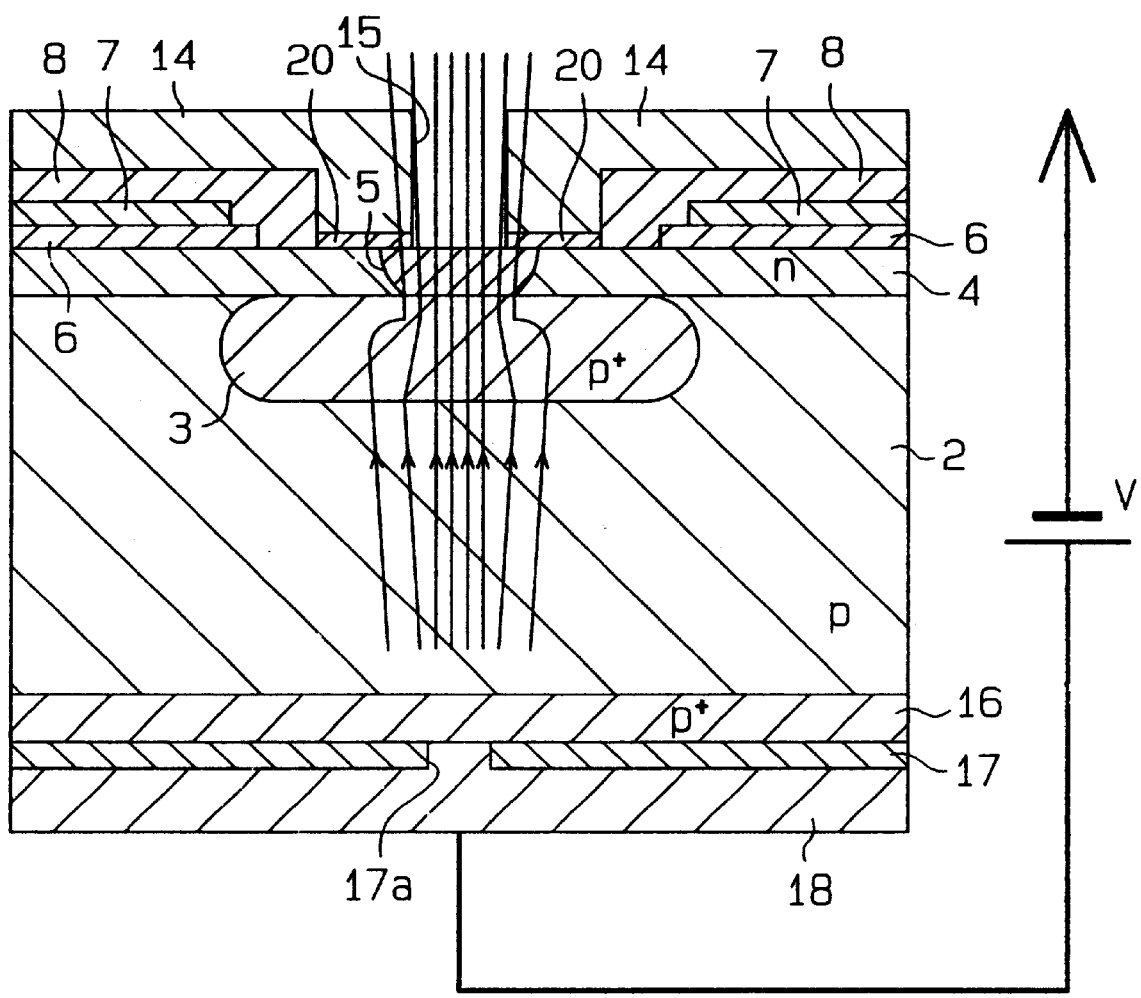
FIG. 1 is a schematic cross-sectional view showing a silicon substrate.

The anodization process according to a first embodiment of the present invention will be described below referring to FIGS. 1 and 2.

It should be noted that in the following embodiments, including the first embodiment, the same or like components are affixed with the same reference numbers as in the prior art respectively, and a detailed description of such elements will be omitted. Film and layers shown in the drawings including FIG. 1 are enlarged for convenience, and their thicknesses are not shown proportional to actual thicknesses.

In this embodiment, a thin metal protecting film (hereinafter simply referred to as metal protecting film) 14 is formed in place of the resin protecting film 9 on the passivation film 8. This metal protecting film 14 is formed to cover the entire surface of the silicon substrate 2 including the upper surface of the passivation film 8 by means of a physical film forming method such as W (tungsten) sputtering and vacuum vapor deposition. The metal protecting film 14 may be formed using molybdenum.

W silicide 20 having a thickness of about 1 μm is formed along the interface between the metal protecting film 14 and the epitaxial growth layer 4 of the silicon substrate 2 over the area immediately below the opening of the passivation film 8. The W (tungsten) comprising the metal protecting film 14 and the W silicide 20 have an HF resistance. After formation of the metal protecting film 14 over the entire surface of the silicon substrate 2, an opening 15 is formed in it by means of photolithography and etching at the portion aligned with the p-type silicon layer 5, as shown in FIG. 1.

A p-type silicon layer 16 is formed by doping using boron as an impurity by means of ion implantation to the silicon substrate 2 on the lower side and heat-diffusing the implanted boron. This p-type silicon layer 16 corresponds to the p-type impurity-diffused area of the present invention and has an electrical resistance which is lower than that of the silicon substrate 2.

An oxide film ($SiO_2$) 17 is formed as an insulating film by means of patterning on the lower surface of the p-type silicon layer 16, and further an electrode layer 18 which is an aluminum thin film is formed by means of physical film forming methods including sputtering and vacuum vapor deposition. The oxide film 17 may be replaced with other insulating films such as of SiN. In the oxide film 17, a connecting opening 17a is formed in alignment with the buried p-type silicon layer 3 and the p-type silicon layer 5. The electrode layer 18 and the p-type silicon layer 16 are electrically connected to each other via the connecting opening 17a. The electrode layer 18 is electrically connected to the p-type silicon substrate 2 via the p-type silicon layer 16.

Figure 2:
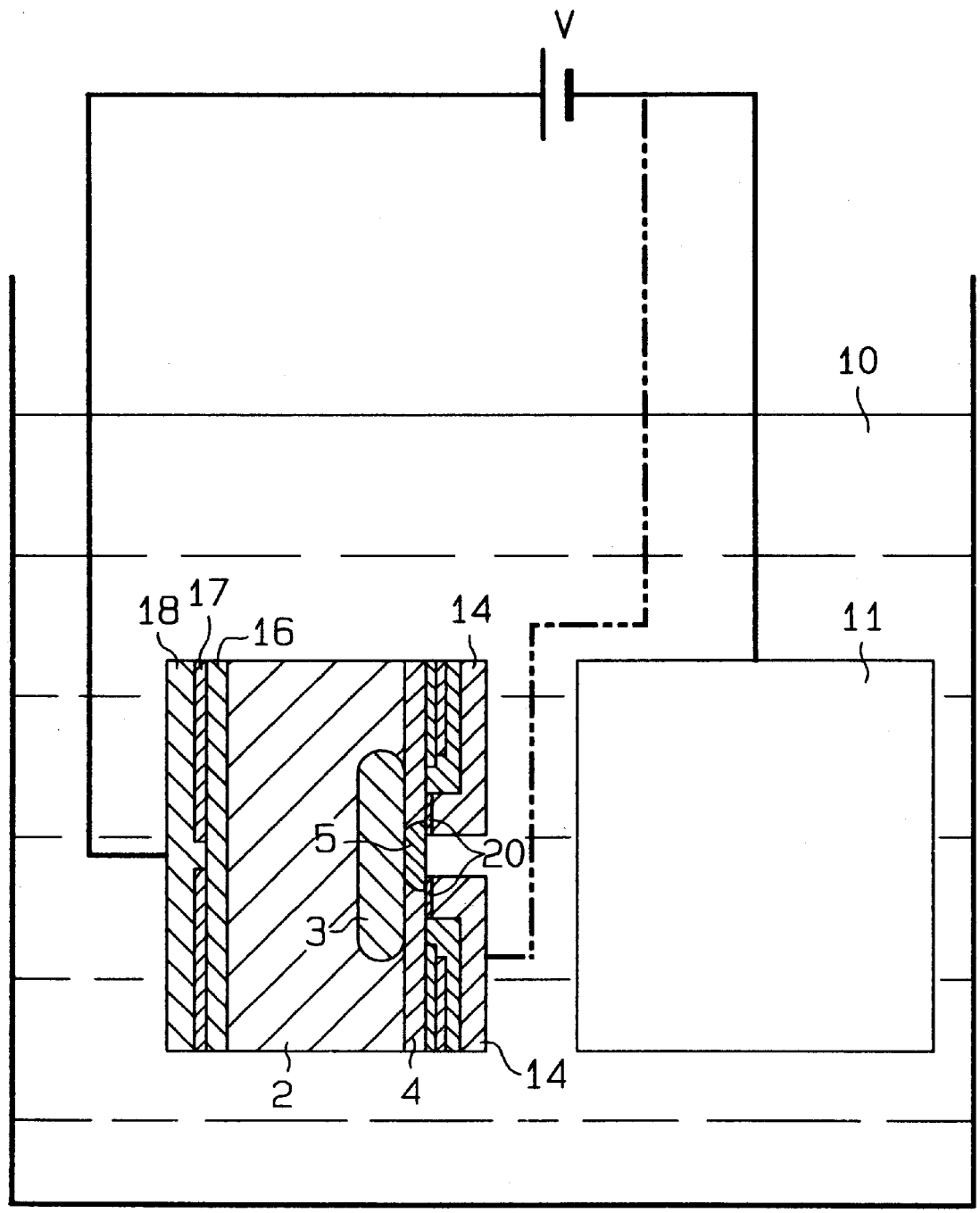
FIG. 2 is a schematic cross-sectional view showing a process for anodizing the silicon substrate shown in FIG. 1.
Figure 3:
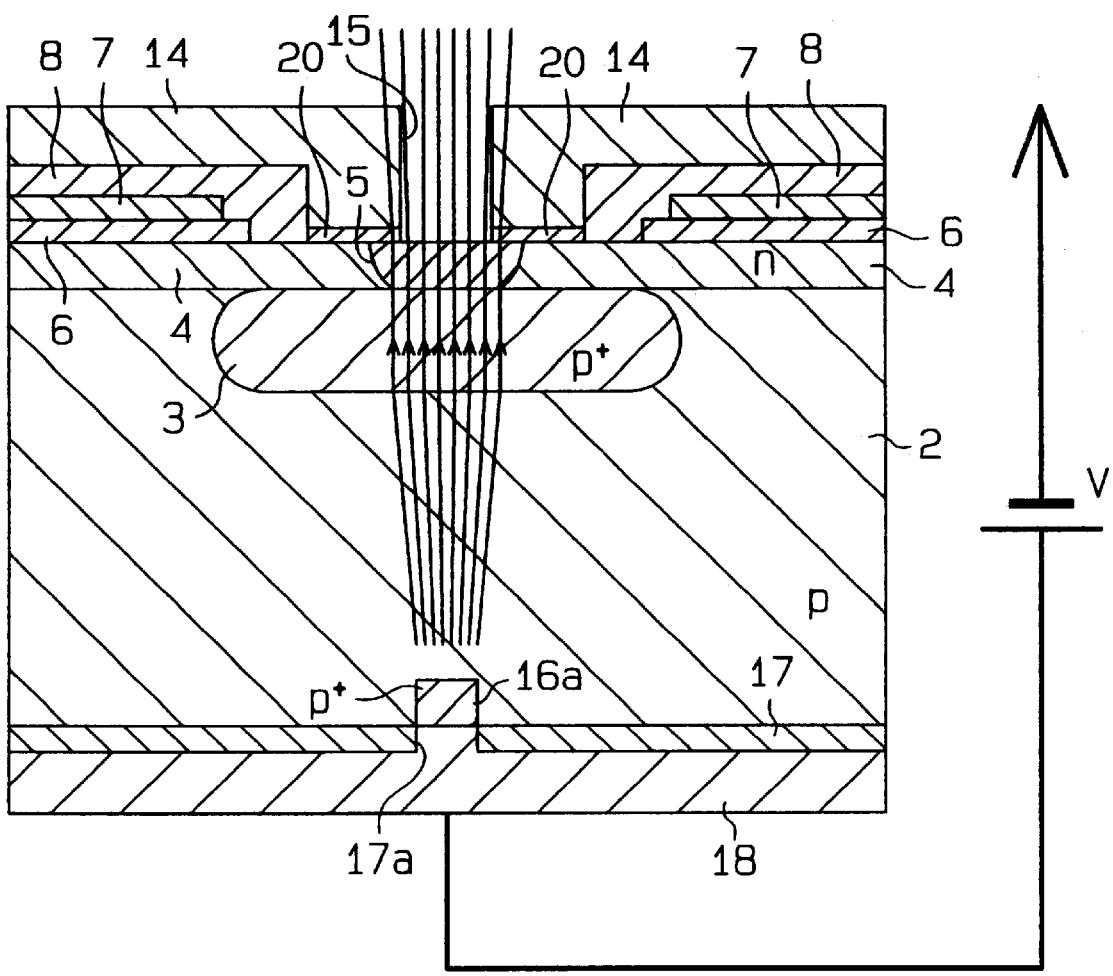
FIG. 3 is a schematic cross-sectional view showing a silicon substrate according to another embodiment.

Next, the silicon substrate 2 is immersed in an aqueous HF solution 10, as shown in FIG. 2. The electrode layer 18 is connected to the positive terminal of a DC power source V, and the negative terminal of the DC power source is connected to the counter electrode 11, and then an electric field is applied between the electrodes to effect anodization.

By this anodization treatment, the p-type silicon layers 3 and 5 are converted to porous silicone layers. In this anodization treatment, porosity is imparted selectively to the areas to be anodized, i.e. the p-type silicon layers 3 and 5 which are the areas to be anodized.

Subsequently, the thus formed porous portions are subjected to anisotropic etching by means of alkali etching using TMAH (tetramethyl ammonium hydroxide). In this treatment, the p-type silicon layers 3 and 5 having undergone the anodization treatment and then the porosity imparting treatment are readily soluble in alkali.

A cavity (not shown) is formed by removing the porous silicon layer by this alkali etching. Thus, the epitaxial growth layer (n-type single crystal silicon) 4 located above the cavity is allowed to constitute a hollow beam and assume an acceleration sensor structure in this embodiment.

The process of the present invention exhibits the following effects.

(1) According to the anodization process of this embodiment, since electric currents flow through the connecting opening 17a from the electrode layer 18 without diffusion, as indicated by the arrows in FIG. 1, the density of the currents flowing into the p-type silicon layers 3 and 5 is increased. Consequently, the rate of anodization for converting the p-type silicon layers 3 and 5 to porous silicon layers is increased compared with the prior art. Further, the occurrence of no diffusion of electric currents increases the density of the electric currents flowing into the p-type silicon layers 3 and 5. That is, porosity can be imparted selectively to the p-type silicon layers 3 and 5, since the flow of electric currents concentrate to them.

(2) The p-type silicon layer 16 having an electrical resistance lower than that of the silicon substrate 2 provided on the lower side of the silicon substrate 2 can reduce contact resistance between the electrode layer 18 and the silicon substrate 2. Even if the anodization treatment is carried out in the absence of this p-type silicon layer 16, the above effect (1) can be exhibited. However, porosity can be more efficiently imparted selectively to the p-type silicon layers 3 and 5, since the low-resistance p-type silicon layer 16 causes electric currents to concentrate to the layers 3 and 5.

(3) The W (tungsten) metal protecting film 14 has a high melting point and also has a coefficient of heat expansion approximate to those of the SiN or $Si_3N_4$ passivation film 8 and of the epitaxial growth layer 4 and adheres with them, causing no separation of the metal protecting film 14.

(4) The portions covered with the metal protecting film 14 are protected by it from attack of the aqueous HF solution. Further, the W silicide 20 present between the metal protecting film 14 and the epitaxial growth layer 4 prevents the aqueous HF solution from intruding into the inside.

Second Embodiment

Next, the anodization process according to a second embodiment of the present invention will be described referring to FIG. 2. The difference between this embodiment and the first embodiment is that the anodization treatment is carried out with the negative terminal of the DC power source being connected not to the counter electrode 11, but to the metal protecting film 14, as indicated by the two-dot chain line shown in FIG. 2.

Figure 6:
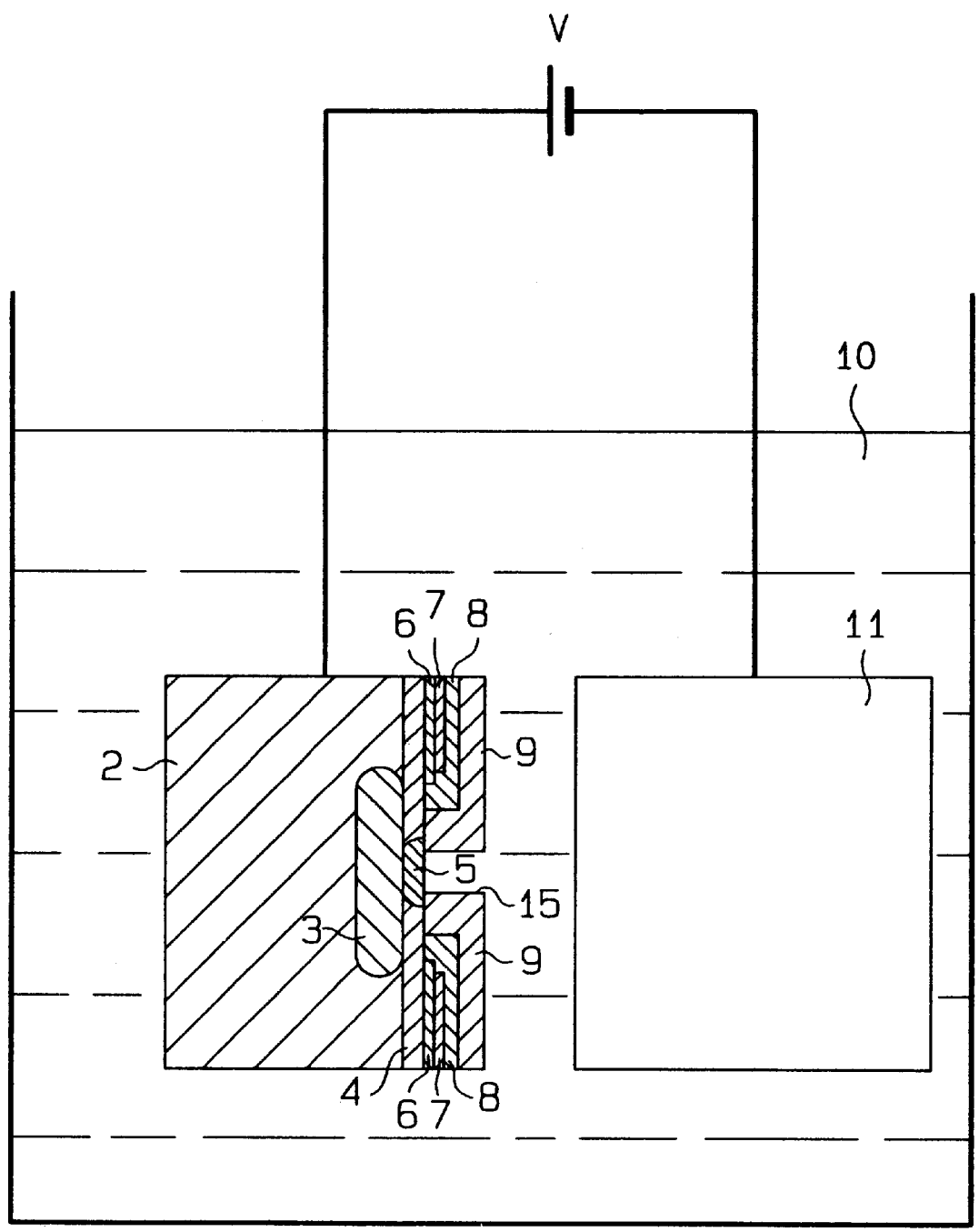
FIG. 6 is a schematic cross-sectional view showing a process for anodizing the silicon substrate shown in FIG. 5.

The anodization process according to the second embodiment exhibits the following merits:

In the conventional anodizing treatment, as shown in FIG. 6, the surface area of the counter electrode 11 should be the same as that of the silicon substrate 2 so as to carry out uniform anodization. Meanwhile, according to the anodization process of this embodiment, since the metal protecting film 14 is used as the counter electrode, there is no need to use a noble metal plate as the counter electrode 11. Accordingly, the anodization treatment can be carried out inexpensively compared with the prior art. Further, since the metal protecting film 14 is formed over almost all over of surface of the silicon substrate 2, anodization can be carried out uniformly.

Furthermore, since the metal protecting film 14 is formed adjacent to the silicon substrate 2 and is used as the counter electrode, there is no need to consider the electrical resistance of the aqueous HF solution 10. In other words, in the case where the silicon substrate and the counter electrode are spaced from each other, the anodization treatment should be carried out under control of the electric current or voltage of the DC power source V considering the electrical resistance of the aqueous HF solution 10. In this embodiment, however, there is no need to consider the resistance of the aqueous HF solution 10, so that the anodization treatment can be more readily facilitated.

Third Embodiment

The anodization process according to a third embodiment of the present invention will be described referring to FIG.

3. It should be appreciated that in the following embodiments including the third embodiment the anodization treatment is carried out by immersing the silicon substrate 2 into the aqueous HF solution.

In this embodiment, a p-type silicon area 16a is formed in place of the p-type silicon layer 16 used in the first embodiment. This p-type silicon area 16a is formed by doping using boron as an impurity, for example, by means of ion implantation into the lower side of the silicon substrate 2 via the opening 17a formed by patterning the oxide film 17 and heat-diffusing the thus implanted boron. This p-type silicon area 16a corresponds to the p-type impurity-diffused area and has an electrical resistance lower than that of the p-type silicon layer 16 in the first embodiment.

Since this p-type silicon area 16a reduces the contact resistance between the electrode layer 18 and the silicon substrate 2, the density of electric currents flowing through the p-type silicon layers 3 and 5 during the anodization treatment is further increased.

Fourth Embodiment

Figure 4:
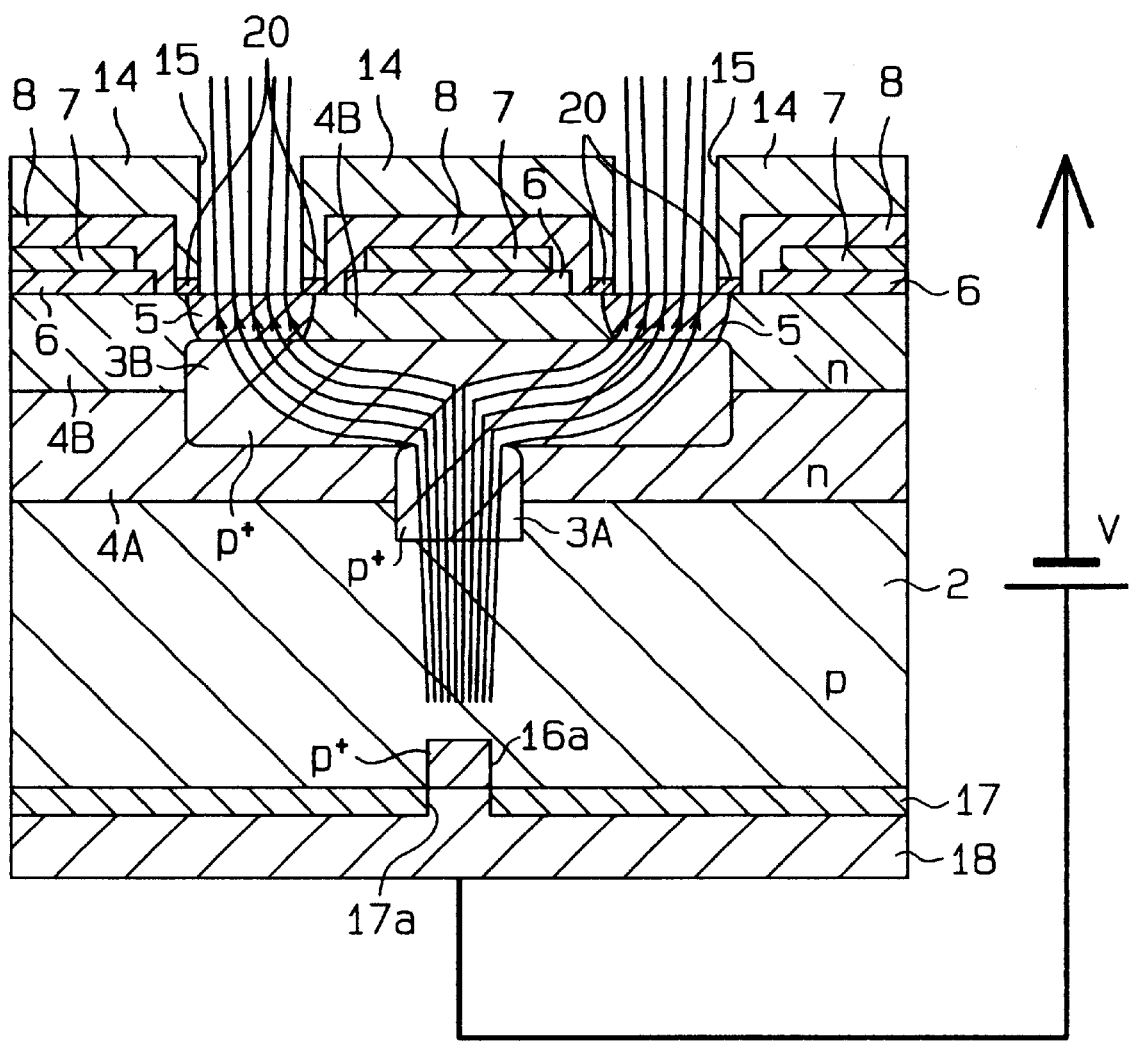
FIG. 4 is a schematic cross-sectional view showing a silicon substrate according to still another embodiment.
Figure 5:
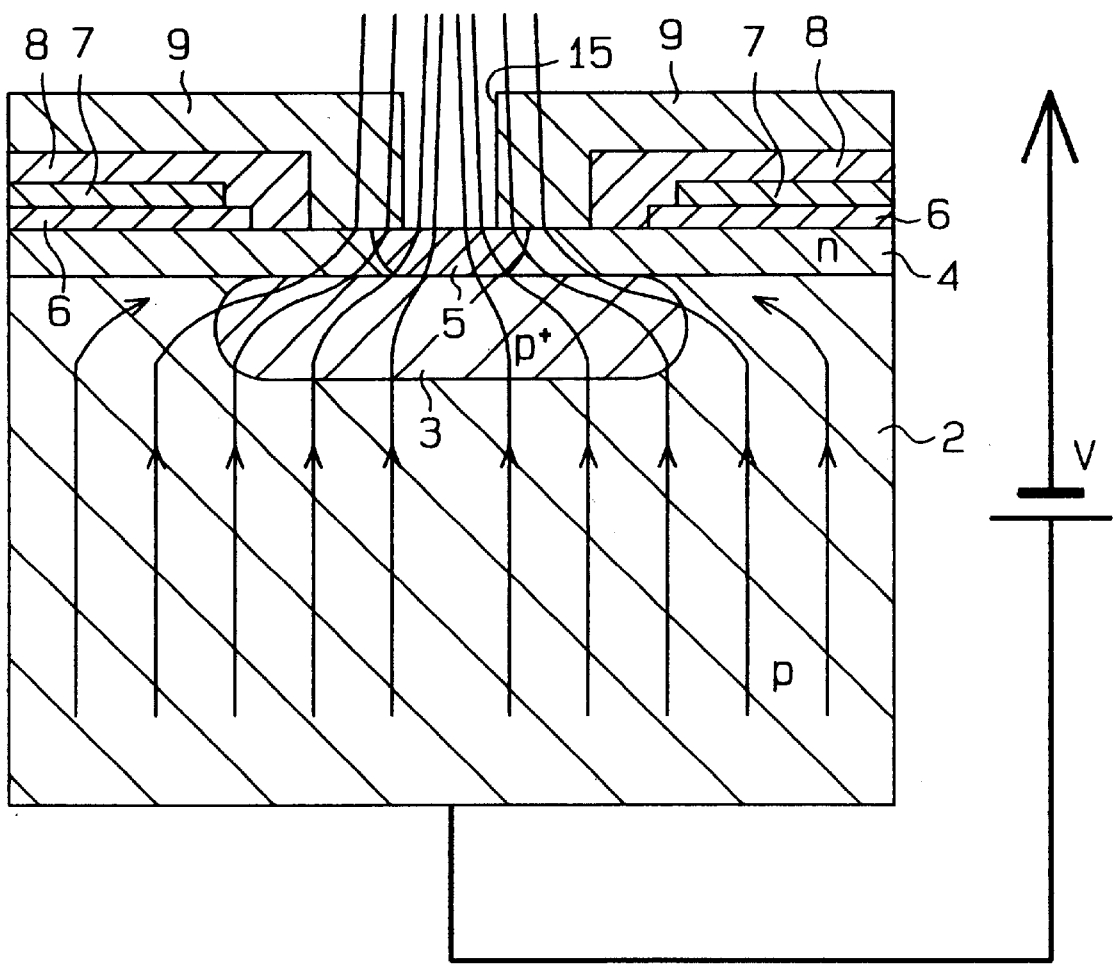
FIG. 5 is a schematic cross-sectional view showing a silicon substrate of the prior art.

Next, the anodization process according to a fourth embodiment of the present invention will be described referring to FIG. 4. As shown in FIG. 4, in this embodiment, two n-type single crystal silicon epitaxial growth layers 4A and 4B are built up on the upper side of the silicon substrate 2, and two p-type silicon layers 3A and 3B are formed as buried layers in the epitaxial growth layers 4A and 4B, respectively. The p-type silicon layers 3A and 3B contain higher concentrations of boron as the impurity than the silicon substrate 2. The p-type silicon layers 3A and 3B are diffused as far as into the silicon substrate 2 and the epitaxial growth layer 4A located below them, respectively. The p-type silicon layers 3A and 3B are brought into contact with each other, and the p-type silicon layer 3A located on the lower side is arranged to oppose the connecting opening 17a. A p-type silicone area 16a is formed on the silicon substrate 2 at the portion aligned with the connecting opening 17a.

Meanwhile, a pair of p-type silicon layers 5 for forming openings 15 are defined in the epitaxial growth layer 4B, spaced from each other. The p-type silicon layers 5 extend from the upper face of the epitaxial growth layer 4B to the p-type silicon layer 3B.

The above silicon substrate 2 is subjected to anodization in the same manner as in the first or second embodiment using the counter electrode 11 or the metal protecting film 14 as the counter electrode.

The p-type silicon layers 3A, 3B and 5 are converted to porous silicon layers by this anodization treatment. The contact resistance between the electrode layer 18 and the silicon substrate 2 is lowered by the p-type silicon area 16a in this anodization treatment, so that electric currents flow through the connecting opening 17a from the electrode layer 18 with no diffusion as indicated by the arrows shown in FIG. 4. Accordingly, the density of electric currents flowing into the p-type silicon layers 3A, 3B and 5 is increased, and the rate of anodization for converting the p-type silicon layers 3A, 3B and 5 into porous silicon layers is increased compared with the prior art. Further, since no diffusion of electric currents occurs, the electric currents are concentrated in the p-type silicon layers 3A, 3B and 5, which are areas to be anodized, and thus porosity can efficiently be imparted to these layers selectively.

Accordingly, the epitaxial growth layer 4B shown at the center of the drawing assumes a hollow structure, when the porous portions are removed by etching.

The embodiments of the present invention may be modified as follows:

(1) The plane-oriented (110) p-type single crystal silicon substrate 2 may be replaced with substrates having other plane orientations (111) and (100).

(2) An alkaline etchant such as KOH, hydrazine, or EPW (ethylenediamine-pyrocatechol-water) may be used in place of TMAH.

(3) The p-type silicon layer 16 in the first embodiment may be omitted. Further, the p-type silicon areas 16a in the third and fourth embodiments may be omitted.

It should be noted here that anodization referred to in this specification is defined to be a series of modification treatments for forming porous layers in a substrate by applying electric currents in an electrolyte to the substrate serving as an anode.

What is claimed is:

1. A process for anodizing a semiconductor device containing a p-type single crystal silicon substrate, the semiconductor device comprising:

a first p-type silicon layer formed on a first side of the substrate over a predetermined area;

an n-type silicon layer formed on the first side of the substrate, the first p-type silicon layer being buried under the n-type silicon layer;

a second p-type silicon layer for forming an opening defined in the n-type silicon layer;

a protecting film formed on the n-type silicon layer with the surface of the second p-type silicon layer being exposed;

a silicide formed between the protecting film and the n-type silicon layer, wherein the protecting film and the silicide are formed of metals having a high HF resistance;

an insulating film formed on a second side opposing the first side of the substrate; and an electrode layer formed on the insulating film, which has a connecting section formed at a portion aligned with the first p-type silicon layer, and connected electrically via the connecting section to the substrate;

the process comprising the steps of:

connecting respectively a positive terminal and a negative terminal of a DC power source to the electrode layer and to a counter electrode disposed to oppose the substrate; and applying a voltage between the electrode layer and the counter electrode in an HF solution so as to impart porosity to the first and second p-type silicon layers.

2. The process for anodizing a semiconductor device according to claim 1, wherein the semiconductor device further comprises a p-type impurity-diffused area formed on the second side of the substrate and in contact with the connecting section.

3. The process for anodizing a semiconductor device according to claim 1, wherein the counter electrode is a protecting film made from a thin metal film.

4. The process for anodizing a semiconductor device according to claim 1, wherein the protecting film is formed either of tungsten or molybdenum.

5. The process for anodizing a semiconductor device according to claim 1, further comprising the step of applying electric currents in order to concentrate to the p-type silicon layer without diffusion.

6. The process for anodizing a semiconductor device according to claim 2, wherein the semiconductor device has a pair of the second p-type silicon layers, and the protecting film has a pair of openings at portions aligned with the second p-type silicon layers, respectively.

* * * * *